United States Patent [19]

Kasa

[11] Patent Number: 4,803,665

[45] Date of Patent: Feb. 7, 1989

[54] SIGNAL TRANSITION DETECTION CIRCUIT

[75] Inventor: Yasushi Kasa, Kawasaki, Japan

[73] Assignee: Fujitsu Limited, Kawasaki, Japan

[21] Appl. No.: 82,547

[22] Filed: Aug. 7, 1987

[30] Foreign Application Priority Data

Aug. 7, 1986 [JP] Japan .................. 61-184264

[51] Int. Cl.$^4$ .......... G11C 7/00; G11C 8/00; H03K 19/094; H03K 19/20
[52] U.S. Cl. .................. 365/230; 365/194; 307/449; 307/463
[58] Field of Search ............ 365/189, 230, 219, 194; 307/449, 463

[56] References Cited

U.S. PATENT DOCUMENTS

| | | | |
|---|---|---|---|
| 4,636,991 | 1/1987 | Flannagan et al. | 365/230 |
| 4,649,521 | 3/1987 | Tsuchida et al. | 365/194 |
| 4,656,608 | 4/1987 | Aoyama | 365/190 |
| 4,656,610 | 4/1987 | Yoshida et al. | 365/189 |
| 4,689,771 | 8/1987 | Wang et al. | 365/230 |

FOREIGN PATENT DOCUMENTS 61-151894 7/1986 Japan .
61-170989 8/1986 Japan .

Primary Examiner—Terrell W. Fears
Assistant Examiner—Melissa J. Koval
Attorney, Agent, or Firm—Staas & Halsey

[57] ABSTRACT

A signal transition detection circuit comprises a decoder circuit (1) for decoding a plurality of signals, a delay circuit (2) having a rise delay time period ($T_r$) and a fall time period ($T_f$) which are different from each other, and a logic circuit (3). The logic circuit performs a logic operation upon the outputs of the delay circuit to generate a pulse signal (ATD) for indicating at least one transition of the signals.

4 Claims, 9 Drawing Sheets

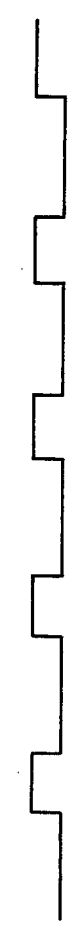
Fig.2A $A_i$
Fig.2B $DA_i$
Fig.2C $S_1$
Fig.2D $\overline{A_i}$
Fig.2E $\overline{DA_i}$
Fig.2F $S_2$
Fig.2G $S_3$
Fig.2H ATD
PRIOR ART

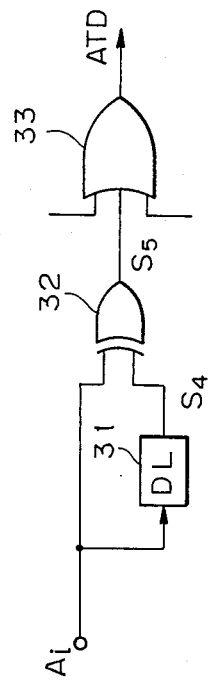
Fig. 3 PRIOR ART
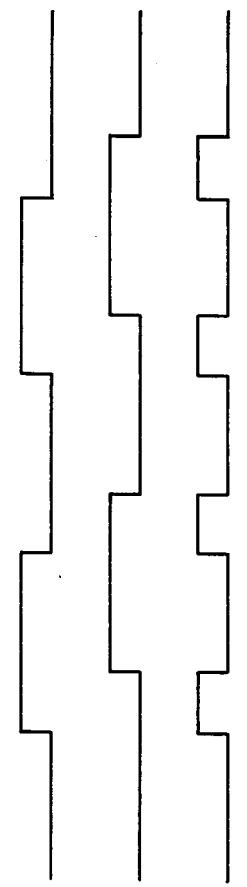
Fig. 4A $A_i$
Fig. 4B $S_4$
Fig. 4C $S_5$
PRIOR ART

4,803,665

SIGNAL TRANSITION DETECTION CIRCUIT

BACKGROUND OF THE INVENTION

1. Field of the Invention

The present invention relates to a signal transition detection circuit which can be used as an address transition detection (ATD) circuit in a semiconductor memory device.

2. Description of the Related Art

In a semiconductor memory device such as a mask ROM, a static RAM, a dynamic RAM, and the like, when an address transition occurs, a reset signal is generated to reset the internal circuit. For this purpose, there has been used an address transition detection circuit, i.e., a signal transition detection circuit.

In the prior art signal transition circuit which will be later explained, the occupied area is relatively large, which is disadvantageous from the viewpoint of the degree of integration.

SUMMARY OF THE INVENTION

An object of the present invention is, therefore, to provide a signal transition detection circuit which is small in size.

According to the present invention, a signal transition detection circuit comprises a decoder circuit for decoding a plurality of signals, a delay circuit having a rise delay time period and a fall time period which are different from each other, and a logic circuit. The logic circuit performs a logic operation upon the outputs of the delay circuit to generate a pulse signal for indicating at least one transition of the signals. Thus, since the decoder circuit is commonly used for other purposes, the area occupied by the signal transition detection circuit can be reduced.

BRIEF DESCRIPTION OF THE DRAWINGS

The present invention will be more clearly understood from the description as set forth below with reference to the accompanying drawings, wherein:

FIGS. 2A through 2H are timing diagrams showing the operation of the circuit of FIG. 1;

FIG. 3 is a circuit diagram illustrating a first prior art signal transition detection circuit;

FIGS. 4A, 4B, and 4C are timing diagrams showing the operation of the circuit of FIG. 3;

DESCRIPTION OF THE PREFERRED EMBODIMENTS

Before the description of the present invention, prior art signal transition detection circuits will be explained with reference to FIGS. 1 through 4.

Figure 1:
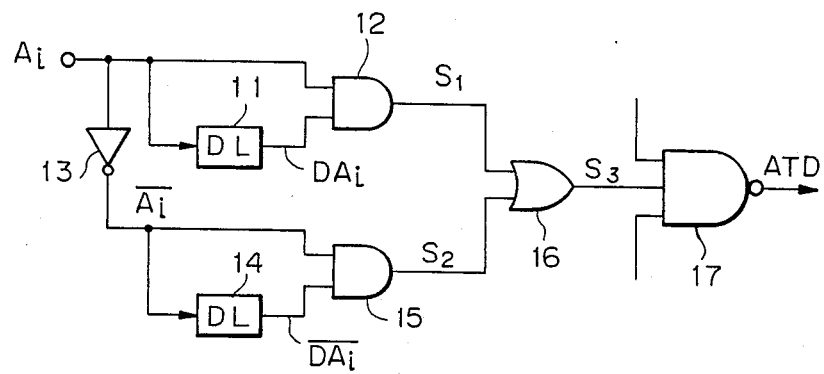
FIG. 1 is a circuit diagram illustrating a first prior art signal transition detection circuit.

In FIG. 1, which illustrates a prior art signal transition detection circuit (see: FIG. 4 of Unexamined Japanese Patent Publication No. 61-151894), a delay circuit 11 and an AND circuit 12 are provided for detecting a rise in an address signal $A_i$, and an inverter 13, a delay circuit 14, and an AND circuit 15 are provided for detecting a fall in the signal $A_i$. Reference numeral 16 designates an OR circuit, and 17 a NAND circuit.

The operation of the circuit of FIG. 1 will be explained with reference to FIG. 2. When the address signal $A_i$ is changed as shown in FIG. 2A, a delay signal $DA_i$ which is an output of the delay circuit 11 is obtained as shown in FIG. 2B. Therefore, the output $S_1$ of the AND circuit 12 is changed as shown in FIG. 2C. Simultaneously, since the address signal $\overline{A_i}$ is changed as shown in FIG. 2D, a delay signal $\overline{DA_i}$, which is an output of the delay circuit 14, is obtained as shown in FIG. 2E. Therefore, the output $S_2$ of the AND circuit 15 is changed as shown in FIG. 2F. As a result, the output $S_3$ of the OR circuit 16 is changed as shown in FIG. 2G, and therefore, an ATD pulse, which is output from the NAND circuit 17, is changed as shown in FIG. 2H.

In FIG. 3, which illustrates another prior art signal transition detection circuit (see Unexamined Japanese Patent Publication No. 61-170989), there are provided a delay circuit 31, an exclusive OR circuit 32, and an OR circuit 33, and therefore, the exclusive OR circuit 32 detects both the rise and the fall in the signal $A_i$ as shown in FIGS. 4A, 4B, and 4C.

In the above-mentioned prior art signal transition detection circuits, however, two series circuits (FIG. 1) for detection of the rise and the fall are required, or an exclusive OR circuit (FIG. 3) having a large number of elements is required, thereby increasing the occupied area, which is disadvantageous from the viewpoint of integration.

Figure 5:
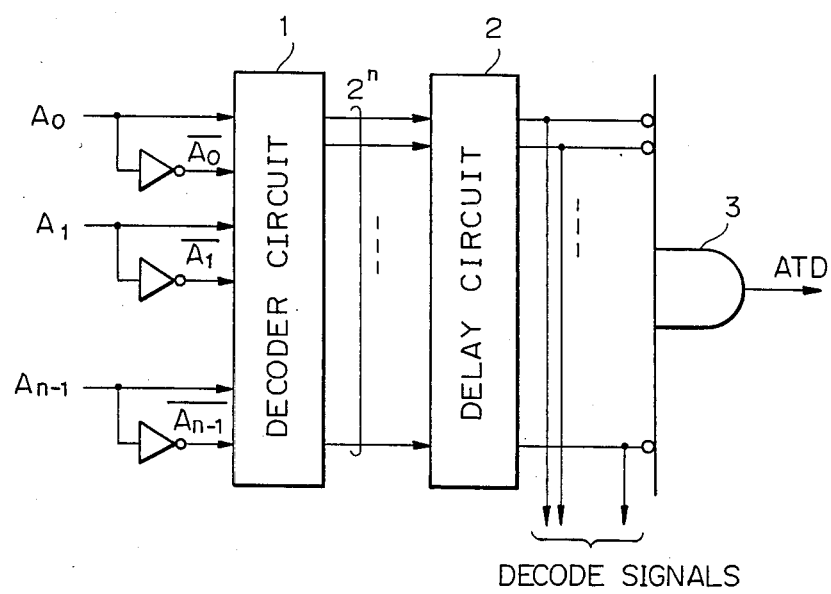
FIG. 5 is a circuit diagram illustrating an embodiment of the signal transition detection circuit according to the present invention.

In FIG. 5, which illustrates an embodiment of the present invention, reference 1 designates a decoder circuit for decoding n address signals $A_0(\overline{A_0})$, $A_1(\overline{A_1})$, ..., $A_{n-1}(\overline{A_{n-1}})$ to generate $2^n$ decoding signals. For example, in a row address decoder for a semiconductor memory device, such decoding signals select one word line from $2^n$ word lines. Connected to the decoder circuit 1 is a delay circuit 2 having rise and fall characteristics which are different from each other. For example, if the high and low levels of a decoding signal of the decoder circuit 1 are a selection level and a non-selection level, respectively, the rise time period of the delay circuit 2 is made larger than the fall time period thereof. A logic circuit 3 performs a logic operation upon the outputs of the delay circuit 2 to generate an ATD signal for indicating at least one transition of the signals $A_0(\overline{A_0})$, $A_1(\overline{A_1})$, ..., and $A_{n-1}(\overline{A_{n-1}})$.

In the above-mentioned configuration, when any one of the address signals $A_0, A_1, \ldots, A_{n-1}$ is changed, all of the outputs (decoding signals) of the delay circuit 2 are in a non-selected state for a predetermined time period. The logic circuit 3 detects a change of the address signals by detecting such a non-selected state.

Figure 6:
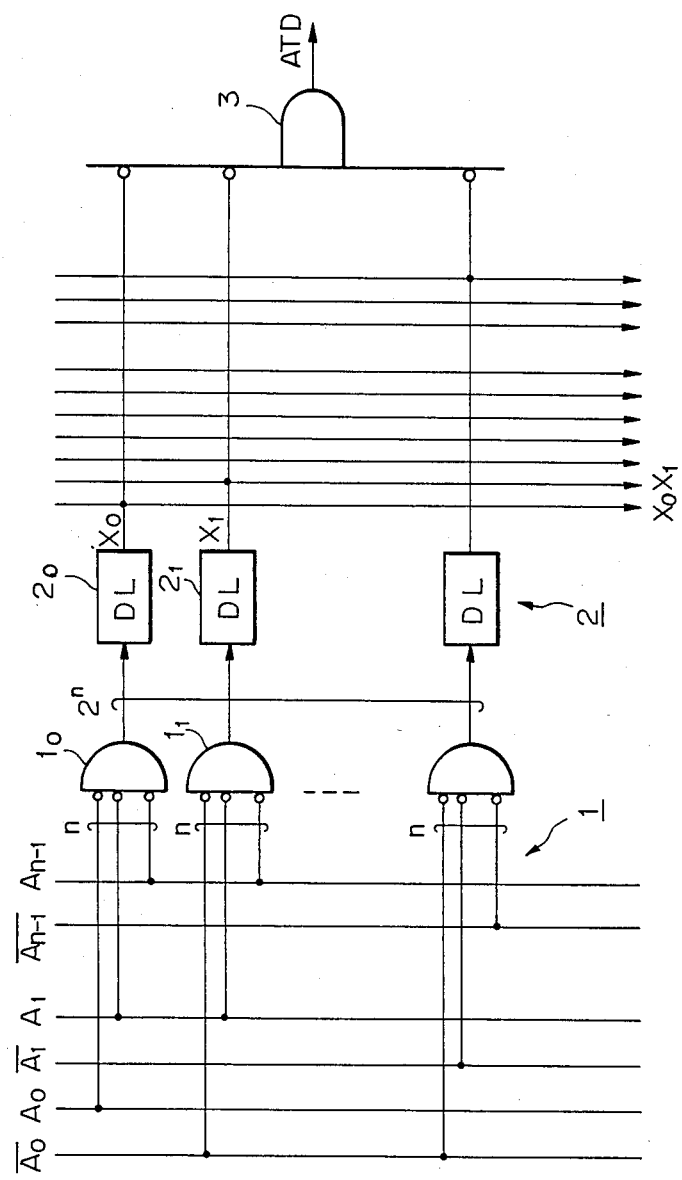
FIG. 6 is a detailed circuit diagram of the circuit of FIG. 5.

In FIG. 6, which is a detailed circuit diagram of the circuit of FIG. 5, the decoder circuit 1 is comprised of $2^n$ NOR circuits $1_0, 1_1, \ldots$, thereby selecting one word line from $2^n$ word lines. That is, if $n=2$, the address signals are defined by $A_0$ and $A_1$, and the NOR circuits are defined by $1_0, 1_1, 1_2$, and $1_3$. In this case, if $(A_0, A_1) = (0, 0)$, the connections for the NOR circuits are provided so that the output of the NOR circuit $1_0$ is made high. If $(A_0, A_1)=(1, 0)$, the connections for the NOR circuits are provided so that the output of the NOR circuit $1_1$ is made high. If $(A_0, A_1)=(0, 1)$, the connections for the NOR circuits are provided so that the output of the NOR circuit $1_2$ is made high. If $(A_0, A_1)=(1, 1)$, the connections for the NOR circuits are provided so that the output of the NOR circuit $1_2$ is made high. The delay circuit 2 comprises delay circuits $2_0, 2_1, \ldots$ connected to the NOR circuits $1_0, 1_1, \ldots$, and the outputs thereof serve as decoding signals and are supplied to the logic circuit 3.

Figure 7:
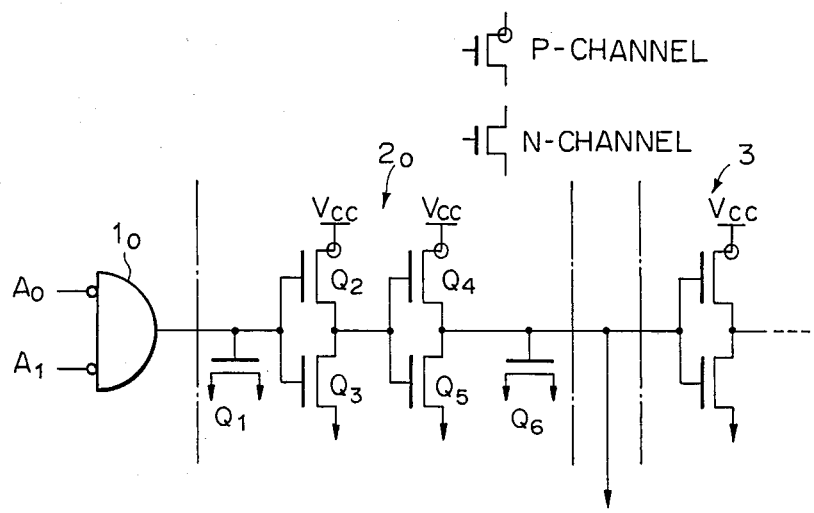
FIGS. 7 and 8 are circuit diagrams of the delay circuit of FIG. 6.
Figure 8:
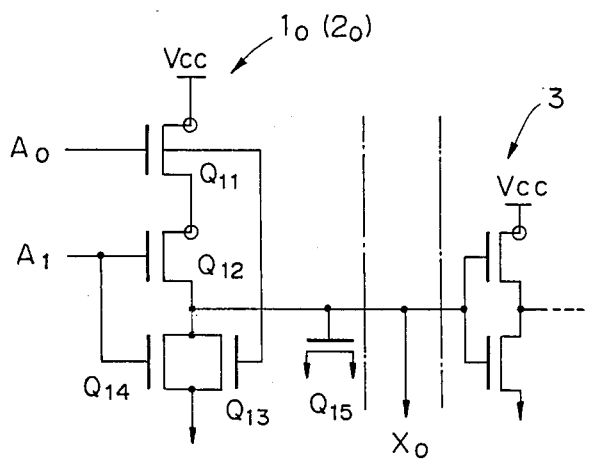

In the delay circuits $2_0, 2_1, \ldots$, as explained above, the rise time period $T_r$ is different from the fall time period $T_f$. For example, if the rise time period is longer than the fall time period, the delay circuit $2_0$ can be comprised of a transistor $Q_1$ as a capacitor; transistors $Q_2$ and $Q_3$ as an inverter; transistors $Q_4$ and $Q_5$ as an inverter; and a transistor $Q_6$ as a capacitor; as illustrated in FIG. 7. Note that the conductance $g_m$ of the P-channel transistor $Q_2$ is larger than that of the N-channel transistor $Q_3$, and the gate capacity of the P-channel transistor $Q_2$ is smaller than that of the N-channel transistor $Q_3$. Contrary to this, the conductance $g_m$ of the P-channel transistor $Q_4$ is larger than that of the N-channel transistor $Q_5$, and the gate capacity of the P-channel transistor $Q_4$ is smaller than that of the N-channel transistor $Q_5$. On the other hand, the delay circuit $2_0$ is incorporated into the NOR circuit $1_0$ by reducing the size of the NOR circuit $1_0$. That is, as illustrated in FIG. 8, the NOR circuit $1_0$ is comprised of two P-channel transistors $Q_{11}$ and $Q_{12}$, two N-channel transistors $Q_{13}$ and $Q_{14}$, and a transistor $Q_{15}$ as a capacitor $Q_{15}$. In this case, the conductance $g_m$ of the P-channel transistors $Q_{11}$ and $Q_{12}$ is smaller than that of the N-channel transistors $Q_{13}$ and $Q_{14}$, and the gate capacity of the transistors $Q_{11}$ and $Q_{12}$ is larger than that of the N-channel transistors $Q_{13}$ and $Q_{14}$.

Note that, if the fall time period $T_f$ is longer than the rise time period $T_r$, the above-mentioned circuits are reversed.

Figure 9:
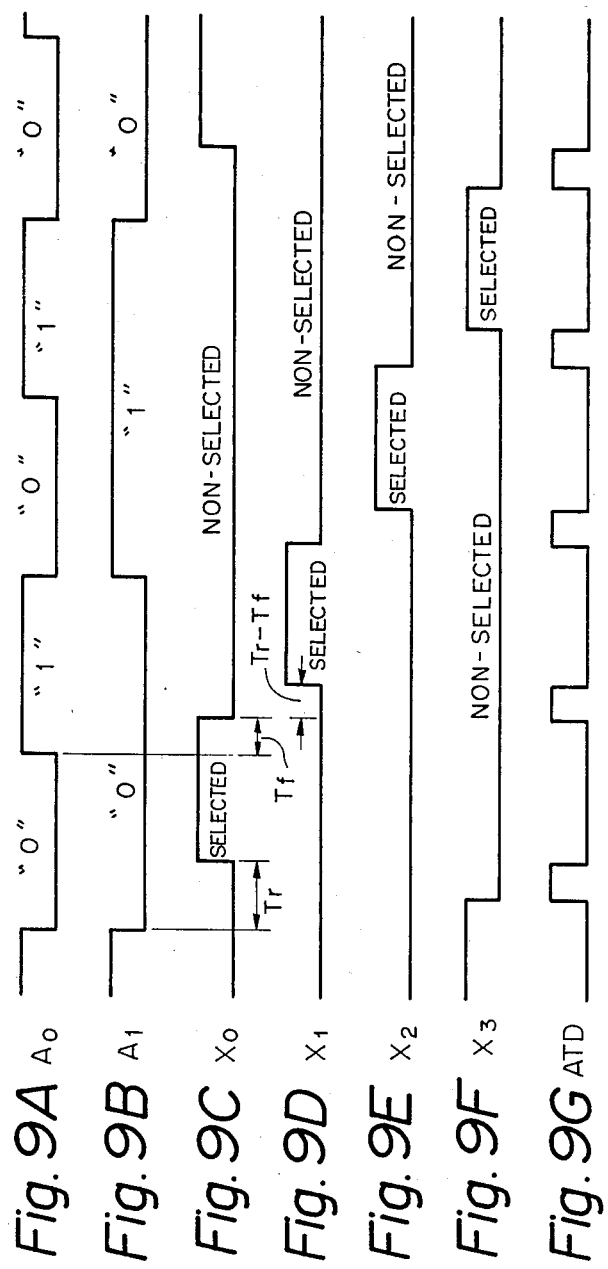
FIGS. 9A through 9G are timing diagrams showing the operation of the circuit of FIG. 6.

The operation of the circuit of FIG. 6 will be explained with reference to FIGS. 9A through 9G. Note that $n=2$, and the rise time period $T_r$ of the delay circuits $2_0, 2_1, 2_2,$ and $2_3$ is longer than the fall time period $T_f$ thereof. When the address signals $A_0$ and $A_1$ are changed as illustrated in FIGS. 9A and 9B, the decoding signal $X_0$ is in a selected state when $(A_0, A_1)=(0, 0)$ (see FIG. 9C); the decode signal $X_1$ is in a selected state when $(A_0, A_1)=(1, 0)$ (see FIG. 9D); the decode signal $X_2$ is in a selected state when $(A_0, A_1)=(0, 1)$ (see FIG. 9E); and the decode signal $X_3$ is in a selected state when $(A_0, A_1)=(1, 1)$ (see FIG. 9F). In this case, the transition time period $T_r$ of each of the decode signals $X_0, X_1, X_2,$ and $X_3$ from a non-selected state to a selected state is shorter than the transition time period $T_f$ from a selected state to a non-selected state. Therefore, when at least one of the address signals $A_0$ and $A_1$ is changed, a non-selection period $(T_r-T_f)$ of all the decoding signals $X_0, X_1, X_2,$ and $X_3$ always occurs. As a result, the logic circuit 3 detects this period $(T_r-T_f)$ and generates an ATD pulse signal as shown in FIG. 9G.

Figure 10:
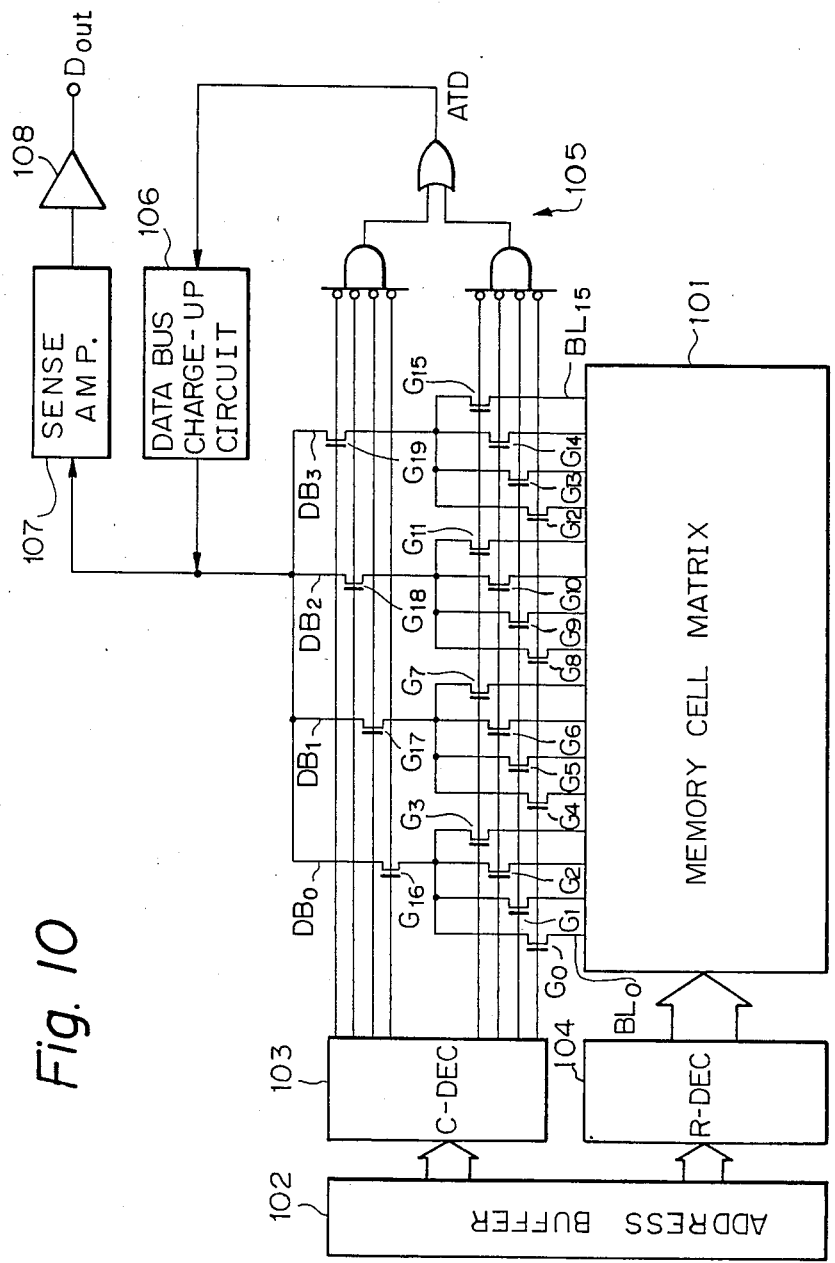
FIGS. 10 and 11 are circuit diagrams illustrating semiconductor memory devices to which the signal transition detection circuit is applied.

In FIG. 10, the signal transition detection circuit according to the present invention is applied to the column portion of a mask ROM. That is, reference 101 designates a memory cell matrix including memory cells; 102 an address buffer; 103 a column address decoder for selecting one bit line from bit lines $BL_0, BL_1, \ldots,$ and $BL_{15}$; 104 a row decoder for selecting one word line from the word lines (not shown); 105 a logic circuit corresponding to the logic circuit 3 of FIG. 5; 106 a bit line charge-up circuit for charging up data buses $DB_0$ to $DB_3$; 107 a sense amplifier; and 108 a data buffer for outputting data $D_{out}$. In FIG. 10, the bit lines $BL_0$ to $BL_{15}$ are divided into four groups. That is, the first group includes the bit lines $BL_0$ to $BL_3$; the second group includes the bit lines $BL_4$ to $BL_7$; the third group includes the bit lines $BL_8$ to $BL_{11}$; and the fourth group includes the bit lines $BL_{12}$ to $BL_{15}$. One bit line within each group is selected by switching gates $G_0$ through $G_{15}$, and one of the groups is selected by switching gates $G_{16}$ through $G_{19}$. The switching gates are controlled by the column decoder 103.

In FIG. 10, the column decoder 103 incorporates a delay function having a rise time period and a fall time period which are different from each other. That is, the column decoder 103 has a similar configuration to that of the decoder circuit of FIG. 8. Therefore, if at least one transition occurs in the column address signals (not shown), the logic circuit 105 generates an ATD pulse signal and transmits that signal to the data bus charge-up circuit 106. As a result, only after one transition of the column address signals, does the data bus charge-up circuit 106 charge the data bus $DB_0$ to $DB_3$ for a predetermined time period corresponding to the time period $(T_r-T_f)$ of FIG. 9.

In FIG. 10, after a column selection is performed upon the memory cell matrix 101 by the column decoder 103, the row decoder 104 performs a row selection operation upon the memory cell matrix 101. That is, after the data buses $DB_0$ to $DB_3$ are charged, a row selection operation is carried out so that the potential at the data buses $DB_0$ to $DB_3$, i.e., the potential at the input of the sense amplifier 107, is determined in accordance with data read out of the memory cell matrix 101.

Figure 11:
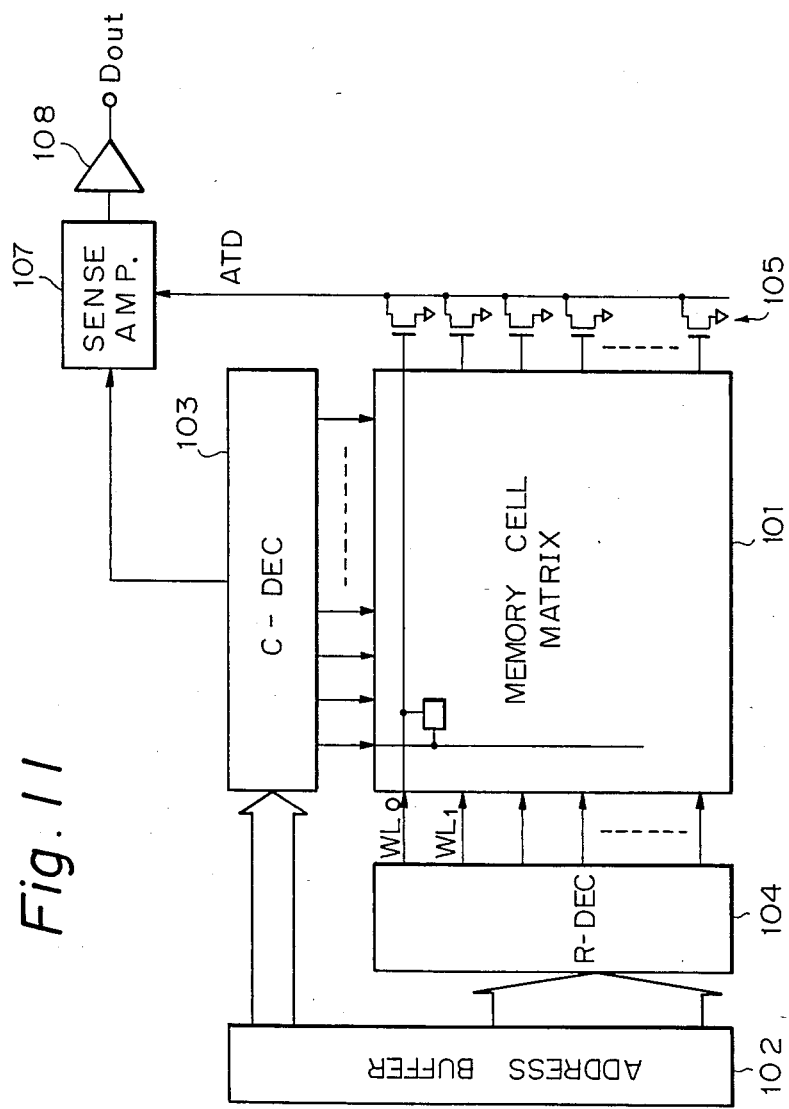

In FIG. 11, the signal transition detection circuit according to the present invention is applied to the row portion of a mask ROM. In FIG. 11, the elements which are the same as those of FIG. 10 are given the same references. In this case, the row decoder 104 incorporates a delay function having a rise time period and a fall time period which are different from each other. Further, the logic circuit 105 comprises a wired OR circuit formed by a plurality of enhancement-type transistors each having a common drain, a gate connected to one of the word lines $WL_0, WL_1, \ldots$, which are also connected to the row decoder 104, and a source connected to the ground. Therefore, when at least one transition occurs in the row address signals (not shown), all the transistors of the logic circuit 105 are turned OFF due to the difference between the rise time period $T_r$ and the fall time period $T_f$ of the row decoder 104, thereby generating an ATD pulse signal. This ATD pulse signal is used for resetting the sense amplifier 107.

In FIGS. 10 and 11, the increase by the addition of the signal transition detection circuit according to the present invention is very small. Especially, in FIG. 11, this increase corresponds to only one bit line.

Note that, in FIG. 5, the decoding signals can be also obtained from the decoder circuit 1, not from the delay circuit 2. Also, note that the present invention can include circuits for detecting a transition of a plurality of signals, other than the address signal transition detection (ATD) circuit for address signals.

As explained above, in the signal transition detection circuit according to the present invention, since the decoder circuit used for other purposes is commonly used in the signal transition detection circuit, the area occupied by the detection circuit is substantially reduced, thus improving the degree of integration thereof.

I claim:

1. A signal transition detection circuit comprising:
   decoder means for decoding a plurality of signals to generate decoding signals;
   delay means, connected to said decoder circuit and having plural outputs, for delaying the decoding signals, said delay means having a rise delay time period and a fall delay time period which are different from each other;
   and wherein each or said delay means comprise a plurality of delay circuits, each including:
   a first capacitor connected to said decoder means;
   two serially-connected inverters connected to said first capacitor and having an output, each of said serially-connected inverters having a rise time period and a fall time period which are different from each other; and
   a second capacitor connected to the output of said serially connected inverters; logic means, connected to said delay means, for performing a logic operation upon the outputs of said delay means to generate a pulse signal indicating a transition of said plurality of signals.

2. A circuit as set forth in claim 1, wherein said delay means is incorporated into said decoder means.

3. A semiconductor memory device comprising:
   memory means having a plurality of memory cells;
   decoder means, connected to said memory means, for receiving address signals to generate decoding signals, thereby selecting one memory cell from said memory means;
   delay means, connected to said decoder means and having plural outputs, for delaying said decoding signals with a rise time period and a fall time period which are different form each other;
   wherein said delay means comprises a plurality of delay circuits, each including:
   a first capacitor connected to said decoder means;
   two serially-connected inverters connected to said first capacitor and having an output, each of said serially-connected inverters having a rise time period and a fall time period which are different from each other; and
   a second capacitor connected to an outputs of said serially connected inverters.
   logic means, connected to said delay means, for performing a logic operation upon the outputs of said delay means to generate an address transition detection signal; and
   reset means, connected to said logic means and to said memory means, for resetting said memory means by said address transition detection signal.

4. A device as set forth in claim 3, wherein said delay means is incorporated into said decoder means.

* * * * *

UNITED STATES PATENT AND TRADEMARK OFFICE
CERTIFICATE OF CORRECTION

PATENT NO. : 4,803,665

DATED : February 7, 1989

INVENTOR(S) : Kasa

It is certified that error appears in the above-identified patent and that said Letters Patent is hereby corrected as shown below:

Col. 2, line 11, "$A_i$" should be --$\overline{A_i}$--;

line 12, "$DA_i$" should be --$\overline{DA_i}$--;

line 15, "$\overline{A_i}$" should be --$A_i$--;

line 16, "$\overline{DA_i}$" should be --$DA_i$--.

Col. 5, line 24, after "inverters;" start a NEW paragraph.

Col. 6, line 19, "outputs" should be --output--;

line 20, "inverters." should be --inverters;--.

Signed and Sealed this

Eighteenth Day of July, 1989

Attest:

DONALD J. QUIGG

Attesting Officer     Commissioner of Patents and Trademarks